United States Patent [19]
Schuster et al.

[11] Patent Number: 6,145,109
[45] Date of Patent: *Nov. 7, 2000

[54] FORWARD ERROR CORRECTION SYSTEM FOR PACKET BASED REAL TIME MEDIA

[75] Inventors: Guido M. Schuster, Des Plaines; Jerry Mahler, Prospect Heights; Ikhlaq Sidhu, Buffalo Grove; Michael Borella, Naperville, all of Ill.

[73] Assignee: 3Com Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/989,616

[22] Filed: Dec. 12, 1997

[51] Int. Cl.[7] .................................................. H03M 13/00

[52] U.S. Cl. ............................................................. 714/752

[58] Field of Search .................................... 714/752, 753, 714/746, 756, 758

[56] References Cited

U.S. PATENT DOCUMENTS

| | | | |
|---|---|---|---|
| 5,003,535 | 3/1991 | May, Jr. et al. | 370/514 |
| 5,115,436 | 5/1992 | McAuley . | |
| 5,389,922 | 2/1995 | Seroussi et al. | 341/51 |
| 5,428,629 | 6/1995 | Gutman et al. | 714/752 |
| 5,563,887 | 10/1996 | Harasaki | 714/756 |
| 5,583,562 | 12/1996 | Birch et al. | 348/12 |
| 5,600,663 | 2/1997 | Ayanoglu et al. | 714/774 |
| 5,608,738 | 3/1997 | Matsushita . | |
| 5,617,541 | 4/1997 | Albanese et al. | 709/207 |
| 5,699,369 | 12/1997 | Guha | 714/774 |

(List continued on next page.)

FOREIGN PATENT DOCUMENTS

WO97/38549  10/1997  WIPO .

OTHER PUBLICATIONS

McAuley, Anthony J., "Reliable Broadband Communication Using A Burst Erasure Correcting Code", Bellcore Computer Communication Research Group (1990), pp. 297–306.

Nonnenmacher, Jorg et al., "Parity–Based Loss Recovery for Reliable Multicast Transmission" (1997), pp. 289–300.

Feher, Kamilo, "Wireless Digital Communications: Modulation and Spread Spectrum Applications" (1995), chapter 5, pp. 254–284.

Sherman, Ken, "Packet Switching", Data Communications (1990), chapter 17, pp. 384–407.

Shacham, N. et al., "Packet Recovery in High–Speed Networks Using Coding and Buffer Management", Information and Telecommunications Sciences Center SRI Int'l, INFOCOM 1990 Conference Publication.

(List continued on next page.)

*Primary Examiner*—Albert De Cady
*Assistant Examiner*—Jason Greene
*Attorney, Agent, or Firm*—McDonnell Boehnen Hulbert & Berghoff

[57] ABSTRACT

A computationally simple yet powerful forward error correction code scheme for transmission of real-time media signals, such as digitized voice, video or audio, in a packet switched network such as the Internet. An encoder at the sending end derives p redundancy blocks from each group of a k payload blocks and concatenates the redundancy blocks, respectively, with payload blocks in the next group of k payload blocks. At the receiving end, a decoder may recover up to p missing packets in a group of k packets, provided with the p redundancy blocks carried by the next group of k packets. The invention thereby enables correction from the loss of multiple packets in a row, without significantly increasing the data rate or otherwise delaying transmission.

15 Claims, 2 Drawing Sheets

Microfiche Appendix Included
(2 Microfiche, 70 Pages)

U.S. PATENT DOCUMENTS

| | | | |
|---|---|---|---|
| 5,703,887 | 12/1997 | Heegard et al. | 714/775 |
| 5,757,416 | 5/1998 | Birch et al. | 348/6 |
| 5,828,788 | 10/1998 | Chiang et al. | 382/239 |
| 5,831,690 | 11/1998 | Lyons et al. | 348/845.2 |
| 5,983,388 | 11/1999 | Friedman et al. | 714/776 |
| 5,993,056 | 11/1999 | Vaman et al. | 714/776 |
| 6,061,820 | 5/2000 | Nakakita et al. | 714/751 |

OTHER PUBLICATIONS

International Search Report for PCT Application Serial No. PCT/US98/26421, Dated Jul. 7, 1999.

Aghadavoodi Jolfaei, M. et al., Improved Selective Repeat ARQ Schemes for Data Communication, Proceedings of the Vehicular Technology Conference, Stockholm, vol. 3, No. Conf. 44, pp. 1407–1411 (Jun. 8–10, 1994).

Silbiger, Herman, R. Draft New Recommendation T.38 (T.Ifax2): "Procedures for Real Time Group 3 Facsimile Communication Between Terminals Using IP Networks", International Telecommunication Union, Telecommunication Standardization Sector, COM 8–50–E (Feb. 1998).

Kalathur, R., et al., "Forward Error Correction with Buffer Management in Multimedia ATM Networks" Southcon/94 Conference Record, 1994, pp. 437–444.

Shacham N., "Packet Recovery and Error Correction in High–Speed Wide–Area Networks", 1989 IEEE, pp. 0551–0557.

Bolot, Jean–Chrysostome et al., "Adaptive Error Control for Packet Video in the Internet", Proceedings of IEEE International Conference on Image Processing, Sep., 1996.

Budge, D. et al., "Media–Independent Error Correction Using RTP", Audio–Video Transport Working Group –Internet Draft, May 1997, pp. 1–17.

FORWARD ERROR CORRECTION SYSTEM FOR PACKET BASED REAL TIME MEDIA

RELATED APPLICATIONS

This document is related to another U.S. patent application filed by the same inventors on the same date, also entitled "A Forward Error Correction System for Packet Based Real Time Media," U.S. Ser. No. 08/989,483, now U.S. Pat. No. 5,870,412 the entirety of which is expressly incorporated herein by reference.

COPYRIGHT

A portion of the disclosure of this patent document contains material that is subject to copyright protection. The copyright owner has no objection to the facsimile reproduction by anyone of the patent disclosure, as it appears in the Patent and Trademark Office patent files or records, but otherwise reserves all copyright rights whatsoever.

A computer program listing that is part of the disclosure of this patent document is available as a microfiche appendix consisting of 2 microfiche and 70 frames.

BACKGROUND OF THE INVENTION

The present invention relates to packet switched telecommunications networks and more particularly to a system for correcting loss of data packets in such a network.

In a packet switched network, a message to be sent is divided into blocks, or data packets, of fixed or variable length. The packets are then sent individually over the network through multiple locations and then reassembled at a final location before being delivered to a user at a receiving end. To ensure proper transmission and re-assembly of the blocks of data at the receiving end, various control data, such as sequence and verification information, is typically appended to each packet in the form of a packet header. At the receiving end, the packets are then reassembled and transmitted to an end user in a format compatible with the user's equipment.

A variety of packet switching protocols are available, and these protocols range in degree of efficiency and reliability. Those skilled in the art are familiar, for instance, with the TCP/IP suite of protocols, which is used to manage transmission of packets throughout the Internet. Two of the protocols within the TCP/IP suite, as examples, are TCP and UDP.

TCP is a reliable connection-oriented protocol, which includes intelligence necessary to confirm successful transmission between sending and receiving ends in the network. According to TCP, each packet is marked in its header with a sequence number to allow the receiving end to properly reassemble the packets into the original message. The receiving end is then typically configured to acknowledge receipt of packets and expressly request the sending end to retransmit any lost packets. UDP, in contrast, is an unreliable connectionless protocol, which facilitates sending and receiving of packets but does not include any intelligence to establish that a packet successfully reached its destination.

In the Internet, loss of entire packets has been found to occur at a rate of over 20% when the network is very congested. Typically, this packet loss occurs one packet at a time. However, at times, multiple sequential packets in a row may be lost. In either case, as those skilled in the art will appreciate, a connection-oriented protocol such as TCP introduces delay into packet transmission, due to its need to request retransmission of these lost packets. While this delay may not be a significant problem in the transmission of pure data signals (such as an e-mail message), the delay can unacceptably disrupt the transmission of real-time media signals (such as digitized voice, video or audio). Therefore, a need exists for a improved system of responding to and correcting packet loss errors.

SUMMARY OF THE INVENTION

The present invention provides a computationally simple yet powerful system for handling packet loss that may arise in the communication of real time media signals, such as digitized voice, video or audio, in a packet switched network. According to the invention, an encoder at the sending end derives p redundancy blocks from each group of a k payload blocks and concatenates the redundancy blocks, respectively, with payload blocks in the next group of k payload blocks. In this way, a decoder at the receiving end may extract lost payload from the redundant blocks carried by succeeding packets and may correct for the loss of multiple packets in a row.

Beneficially, regardless of the number of packets in a row to be recovered by this correction scheme, the size of the forward error correction code employed by the present invention is of the same order as the payload itself. The present invention does not increase the packet rate and may perform its function without introducing significant delay into the transmission process.

These as well as other advantages of the present invention will become apparent to those of ordinary skill in the art by reading the following detailed description, with appropriate reference to the accompanying drawings.

BRIEF DESCRIPTION OF THE DRAWINGS

A preferred embodiment of the present invention is described herein with reference to the drawings, in which.

DETAILED DESCRIPTION OF THE PREFERRED EMBODIMENT

Figure 1:
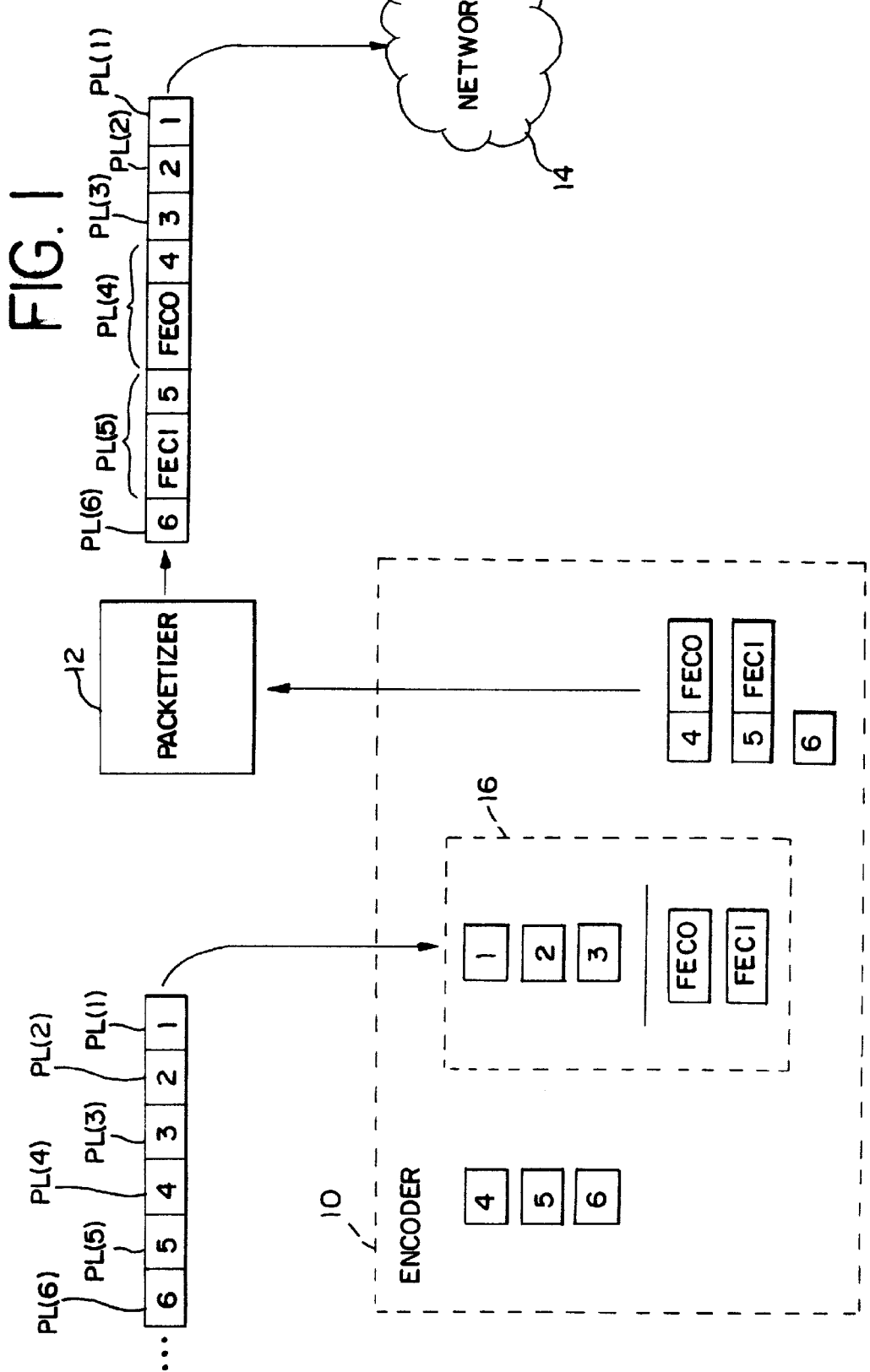
FIG. 1 depicts an encoder operating in accordance with a preferred embodiment of the present invention.

The present invention provides an improved system for communicating substantially real time media signals through an unreliable digital transmission channel. The invention may find particular use for transmission of digitized video or audio (including, for instance, voice) signals over the Internet. In the preferred embodiment, the invention employs a computationally simple error correction scheme that enables the recovery of lost data packets within specified limits, while beneficially adding very little delay in transmission time.

For purposes of illustration, the following description will assume that an audio or video signal has been converted into a digital data stream and is to be transmitted in a network from a first node to a second node. It will be appreciated, of course, that the invention is not restricted to use in a traditional network configuration but may extend to any communication path through which a sequence of packets are transmitted, including, for instance, a direct path. In the preferred embodiment, however, the signal at issue is to be transmitted between nodes of a network such as the Internet.

The description will further assume by way of example that the digital data stream, or payload, has been divided into a sequence of frames (or payload packets or payload blocks), PL[1], PL[2], PL[3], PL[4], PL[5], PL[6], ..., PL[k]. In this example, each of these payload packets consists of a set number of bytes or bits and preferably represents a portion of a signal to be transmitted through a network.

This description additionally assumes that the packets will be transmitted in a network according to a packet switching protocol that employs a bit-wise or other high resolution verification scheme such as a checksum or parity bit. Therefore, it will be assumed that a technique is in place to respond to loss of some portion of a successfully transmitted packet.

Remaining at issue, however, is how to correct for loss of one or more entire packets.

As discussed in the Background section above, the TCP protocol offers one method for responding to loss of packets in a digital transmission network. According to TCP, the receiving node may be configured to acknowledge receipt of packets and expressly request the transmitting node to retransmit any lost packets. This request and retransmission system is generally accurate. However, as noted above, the system is not well suited for use in the context of real-time media transmissions, because the transmission of such signals is very sensitive to the delay introduced by retransmission requests.

Rather than employing a request and retransmission system, greater efficiency in packet loss correction may be achieved by transmitting a correction code of some sort concurrently with the payload data, thereby providing the receiving end with sufficient information to recover lost packets. Several error correction code mechanisms are available for this purpose. These mechanisms include, for instance, interleaving and block coding.

Interleaving is commonly used in wireless communications, providing an effective method to combat error bursts that occur on a fading channel. Interleaving generally calls for spreading the bits of each codeword (or payload packet) apart from each other so they experience independent loss and so that the original data may be more readily recovered.

Block coding, in turn, calls for mapping a frame of binary source data into a coded block of data that includes a set of redundant parity symbols. By conventional terminology, a block coder typically converts a group of k payload units (such as bytes or bits) into a larger group of n units by adding $p=n-k$ parity units or forward error correction (FEC) codes to the group. Each parity packet is generated through a predetermined coding technique based on all or some subset of the k payload units. One of the simplest forms of a block code is a repetition code, in which the binary source data is repeated as a set of parity bits.

Unfortunately, however, the addition of redundant parity packets gives rise to increased complexity and delays in transmission. In a packet switched network, routers route packets based on information contained in the packet headers. Therefore, the amount of work performed by a packet router generally relates directly to the number of packets being routed. Because each packet, whether payload or parity, contains its own header, an increase in packet rate consequently increases the burden on network routers and could delay transmission time or, in theory, cause a network to fail.

Adding separate parity packets to the transmission sequence is a particular waste of resources when done in the context of some of the more common real-time media transmission protocols, because many of the existing protocols add substantial overhead to each packet. For instance, the G.723.1 voice coder provides 24 bytes of payload every 30 milliseconds. These 24 bytes are then put into an RTP packet, which in turn is put into a UDP packet, which in turn is put into an IP packet, so that the total packet length is now $24+16+8+20=68$ bytes. A parity packet destined for the same receiving end as an adjacent payload packet would have a header almost identical to the header of the payload packet. Yet the parity packet would still require the full 44 bytes of overhead, resulting in a waste of bandwidth. As this example illustrates, traditional block coding techniques are therefore not well suited for correcting packet loss in real time media transmissions.

To avoid an increase in packet rate, another technique for providing parity information is to append redundant parity information to existing payload packets. For instance, as an offshoot of traditional repetition codes, the transmitting node may append to each payload packet redundant copies of the preceding n number of payload packets. In this way, the receiving end may readily recover a lost packet PL[k] from one of the n subsequent packets PL[k+1] ... PL[k+n]. For instance, with n=2, payload packets PL[k-1] and PL[k-2] would be redundantly appended to and transmitted together with payload packet PL[k], providing the following transmission packets P[k], for example:

| P[1] | = | {PL[1], | PL[0], | PL[-1]} |
| P[2] | = | {PL[2], | PL[1], | PL[0]} |
| P[3] | = | {PL[3], | PL[2], | PL[1]} |
| P[4] | = | {PL[4], | PL[3], | PL[2]} |
| P[5] | = | {PL[5], | PL[4], | PL[3]} |
| P[6] | = | {PL[6], | PL[5], | PL[4]} |
| P[7] | = | {PL[7], | PL[6], | PL[5]} |
| P[8] | = | {PL[8], | PL[7], | PL[6]} |
| P[9] | = | {PL[9], | PL[8], | PL[7]} |
| * * * | | | | |
| P[k] | = | {PL[k], | PL[k-1], | PL[k-2]} |

With this scheme, in the event a payload packet is lost in transmission, the receiving end may simply extract a redundant copy of the payload from one of the n subsequent data packets.

By appending n preceding payload packets to each current data packet P[k], it becomes possible to recover n lost packets in a row without having to request retransmission. As more preceding packets are concatenated with each current packet, the network can tolerate a higher rate of packet loss. Additionally, this method will not affect the packet rate or routing rate, since, as noted above, the routing rate is concerned principally with the header information in a given packet, rather than with the size of each packet. Unfortunately, however, by concatenating multiple payload packets, this method necessarily and substantially increases the data rate. For instance, to be able to correct for two lost packets in a row (n=2) this method nearly triples the size of every packet. Therefore, this method is also not desirable.

Instead, the present invention beneficially provides a suitable and less costly scheme of correcting for packet loss, adding very little delay to transmission time. The invention preferably employs a coding technique in which parity bits associated with current packets are piggybacked onto future packets. Rather than concatenating multiple previous payload packets with each current payload packet (and thus greatly raising the data rate), the preferred embodiment of the present invention calls for concatenating a single forward error correction (FEC) code (block code, or redundancy block) with specified payload packets in a way that enables the recovery of multiple lost packets in a row.

According to a preferred embodiment of the present invention, as a sequence of payload blocks is being transmitted, every k payload blocks in the sequence are fed through a block coder to create p=n−k forward error correction (FEC) codes or redundancy blocks, where p≦k. These p redundancy blocks are then concatenated respectively with the next p payload blocks being transmitted. In turn, at the receiving end, if a packet is lost, the associated payload may be extracted from the redundancy blocks carried by the appropriate packets.

The present invention may employ substantially any block coder now known or later developed in order to create the required p redundancy blocks. Of course, the choice of block coder, including the choice of the (n, k) values used by the coder, may depend on a number of factors, including the efficiency required for the specified application. In the preferred embodiment, for transmission of real-time media signals over the Internet, the invention employs the well known Reed-Solomon (RS) class of codes over the $2^8$ Galois field. Also referred to as RS erasure codes, these codes are optimal in their ability to correct erased bytes. For example, provided that 8 bytes are protected with 3 parity bytes (a total of 11 bytes) any three bytes can be lost and the original 8 bytes may still be recovered.

FIG. 1 illustrates by way of example an encoder 10 operating in accordance with the present invention. In the example shown, a stream of fixed length packets or payload blocks arrives. The first six of these payload blocks, PL[1] through PL[6], are shown. For purposes of this example, the encoder employed by the invention is an RS block coder having (n, k) values of (5, 3). Thus, for every three payload blocks in the incoming sequence, the coder derives two FEC codes or redundancy blocks, FEC0 and FEC1. According to the invention, the encoder then appends theses redundancy blocks, respectively, to the next two payload blocks, which are the first two payload blocks in the next group of three.

Referring to FIG. 1, as each of the first three payload blocks, PL[1], PL[2] and PL[3], arrives, encoder 10 writes copies of these payload blocks into memory for use in creating the required redundancy blocks. The encoder then forwards each of these three payload blocks to a packetizer 12, which adds header information and passes resulting packets, P[1], P[2] and P[3], along for transmission to the network 14. (For purposes of example, FIG. 1 does not show the header information or other overhead information included with these output packets.) Because these are the first three payload blocks, they are transmitted without any added redundancy blocks.

Using the copies of payload blocks PL[1], PL[2] and PL[3] that it stored in memory, the encoder then derives two redundancy blocks, FEC0 and FEC1, as indicated at section 14 in FIG. 1. In particular, the RS block coder operates symbol-wise (for example, byte-wise) on the payload symbols to create corresponding bits of the FEC symbols. The left most symbol of each of the payload blocks PL[1], PL[2] and PL[3] is used to derive the left most symbols of the redundancy blocks, the next symbol of each of the payload blocks PL[1], PL[2] and PL[3] is used to derive the next most symbols of the redundancy blocks, and so forth. As a result, the size of the redundancy blocks employed by the present invention is of the same order as that of the payload blocks with which they will be concatenated.

After generating redundancy blocks FEC0 and FEC1, the encoder preferably purges payload blocks PL[1], PL[2] and PL[3], writes copies of the next three payload blocks, PL[4], PL[5] and PL[6], to memory, and concatenates with payload blocks PL[4] and PL[5], respectively, the two redundancy blocks that it derived from payload blocks PL[1], PL[2] and PL[3]. To continue steady transmission, the encoder then passes the concatenated symbols {PL[4], FEC0} and {PL[5], FEC1} as well as payload block PL[6] to the packetizer 12 to generate packets P[4], P[5] and [P6] for transmission to the network.

While FIG. 1 shows only the first six payload blocks and resulting packets, it will be appreciated that this process continues as long as a payload stream continues to arrive at the encoder. Thus, using a block coder with (n, k) values of (5, 3), the first two packets in every group of three packets transmitted to the network will each preferably include a redundancy block derived from the payload blocks in the previous three packets.

Of course, it will also be appreciated that the present invention is not restricted to appending the redundancy blocks specifically to the next payload packets following the group from which the redundancy blocks were derived, but other arrangements may be used. For instance, using a (5, 3) block coder as discussed above, the two redundancy blocks FEC0 and FEC1 derived from payload blocks PL[i], PL[i+1] and PL[i+2] could regularly be concatenated, respectively, with PL[i+4] and PL[i+5] rather than with PL[i+3] and PL[i+4].

Because an encoder operating according to the preferred embodiment of the present invention is an RS block coder, the invention presumes that the payload blocks being combined are all of the same length (for instance, the same number of bits). With a slight adjustment, however, the invention will work equally well in a network of variable length packets (and/or fixed length packets). Provided with payload blocks of various lengths, the invention contemplates padding the shorter payload blocks in each group of k payload blocks (every three payload blocks in the above example) with zeros, so that all k blocks are the same length. For instance, with a (5, 3) block coder, if the first two of three incoming payload blocks are 16 bits long but the third is 24 bits long, the encoder will pad the first two blocks with 8 zero bits so that all three blocks are 24 bits long. The encoder will then derive the necessary redundancy blocks FEC0 and FEC1, each of which, in this example, will also be 24 bits long.

In order to conserve bandwidth, the encoder of the present invention then preferably strips payload blocks of any padded zeros before passing the blocks to the packetizer for packetizing and transmission. At the same time, however, in order to facilitate recovery of lost packets (i.e., decoding) at the receiving end, the encoder preferably concatenates with each payload block an indication of how long the payload block needs to be for decoding. Additionally, if a redundancy block is to be included in a packet, the encoder of the present invention preferably includes in the concatenated symbol an indication of how long the redundancy block is, in order to indicate where the redundancy block ends. Thus, for instance, in the above example, the encoder preferably adds to the symbol extra bits indicating that the payload block needs to be 24 bits long for decoding, and the encoder adds to the symbol extra bits indicating that the redundancy block is 24 bits long.

Figure 2:
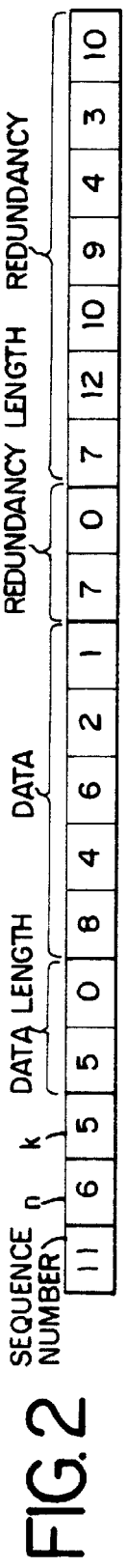
FIG. 2 depicts a packet encoded in accordance with a preferred embodiment of the present invention.

Consequently, to facilitate decoding in the preferred embodiment, a packet that is transmitted according to the present invention preferably includes indications of the sequence number or packet number, the (n, k) values, the payload/data length, the payload/data block, the redundancy block length (if any) and a redundancy block (if any). FIG. 2 illustrates an example of a packet containing this information, where the encoder employs a block coder using (n, k) values (6, 5), and where a redundancy block (FEC) has been concatenated with a payload block. Alternatively, it will be appreciated that the (n, k) values could be agreed upon in advance so that the values of n and k need not be included in each packet header.

In most cases, the packets of information encoded according to the present invention are successfully transmitted through a network from the sending end to a receiving end. As discussed above, however, a number of these packets may be lost along the way and never make it to the receiving end. In the Internet, for instance, it is normal to lose 3% to 5%, and even up to 20%, of packets. Therefore, at the receiving end, a decoder is should be in place to recover missing packets.

Figure 3:
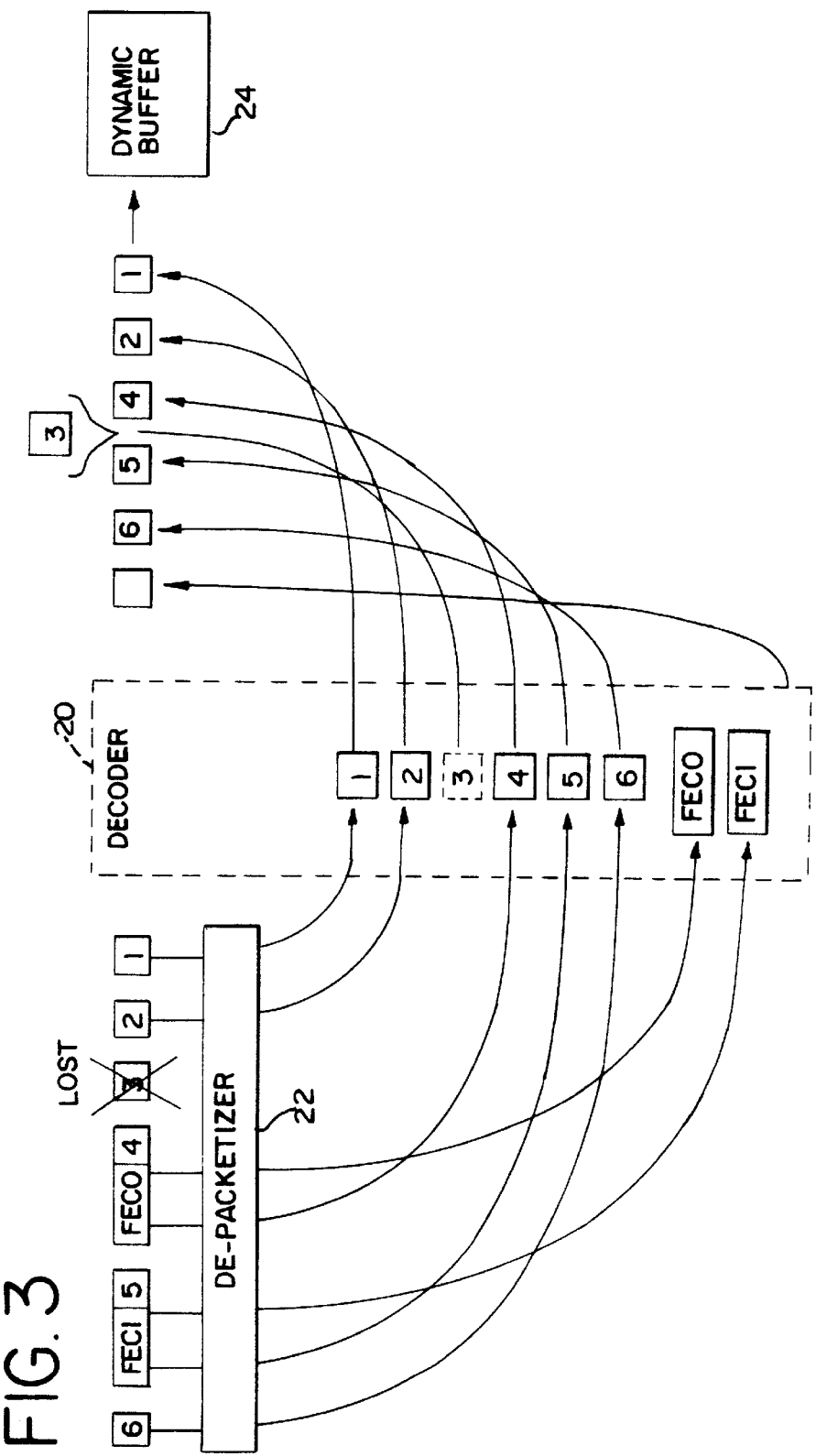
FIG. 3 depicts a decoder operating in accordance with a preferred embodiment of the present invention.

FIG. 3 illustrates a decoder 20 operating in accordance with a preferred embodiment of the invention. As shown in FIG. 3, a stream of packets arrives at the receiving end. These packets are illustrated arriving in sequential order. However, it will be appreciated that the present invention is not limited to sequential packet transmission. Rather, depending on the packet switching protocol in use, these packets may arrive in sequential order or out of order. A packet switching protocol such as ATM, for instance, transmits packets in sequence. However, in other transmission systems, sequentially numbered packets might be routed differently through a network and therefore do not arrive at the receiving end in their original sequence.

As shown in the example of FIG. 3, all of the packets P[1] through P[6] have arrived successfully at the receiving end except for packet P[3]. According to the present invention, each of these packets is parsed by a de-packetizer 22 to remove payload or redundancy blocks from packet header information. Those payload blocks that arrived successfully are preferably forwarded directly to a dynamic buffer 24, which serves to put the payload blocks in proper sequence for receipt by an end user.

Additionally, the parsed payload blocks and redundancy blocks are stored as necessary in memory, with memory space preferably allocated according to the payload length and redundancy length that were indicated in the packet. To facilitate decoding and recovery of any lost packets, the number of blocks stored in memory may depend on the (n, k) values of the block coder originally used for encoding. In the example shown, packet P[3] (and therefore payload block PL[3]) is missing. Further, assume that the (n, k) values of the encoder are (5, 3). Accordingly, the decoder 20 stores in memory at least payload blocks PL[1] and PL[2] and redundancy blocks FEC0 and FEC1. Decoder 20 need not store payload blocks PL[4], PL[5] and PL[6] in memory in this example, because no payload in that group of three (k) is missing. Nevertheless, to illustrate context, packets P[4], P[5] and P[6] are depicted in the decoder.

In the preferred embodiment, every time decoder 20 receives new data, it determines whether the new data can help to recover missing information. Thus, in the example shown in FIG. 3, after decoder 20 has received payload blocks PL[1], PL[2] and PL[4] and redundancy block FEC0 (which was transmitted with payload block PL[4]), it recognizes that payload block PL[3] is missing. Given the (5, 3) RS block coder used in this example, decoder 20 can recover the missing payload block PL[3]. In particular, decoder 20 may employ a (5, 3) RS decoder to derive PL[3], given PL[1], PL[2] and FEC0.

Once decoder 20 recovers the missing payload block PL[3], it passes PL[3] to the dynamic buffer 24. Dynamic buffer 24 in turn places PL[3] in sequential order between payload blocks PL[2] and PL[4] and forwards the ordered payload to the end user.

As those skilled in the art will appreciate from the foregoing, in the example shown, if any two of three sequential payload blocks are then lost, the RS block decoder will be able to recover the lost data as long as the necessary redundancy block(s) arrive. In particular, in the example, if up to two of packets P[1], P[2] and P[3] are lost, decoder 20 can recover the lost payload as long as packets P[4] and P[5], and therefore redundancy blocks FEC0 and FEC1, arrive successfully. Note that if only one packet P[1], P[2] or P[3] was lost, only one packet P[4] or P[5] needs to arrive, since one FEC block is enough to reconstruct one lost data block.

The present invention thus conveniently enables the correction of burst errors (the loss of multiple sequential packets in a row), as long as the required redundancy blocks arrive successfully. In this regard, it is further contemplated that a still more robust solution to packet loss may be achieved by widely distributing the redundancy blocks, or portions of the redundancy blocks, within the k packets following those from which the redundancy blocks were derived, rather than placing the redundancy blocks in adjacent packets. By doing so, there may be less chance that the redundancy blocks themselves will be lost as a result of a burst error.

As noted above, by selecting desired (n, k) values, it is possible to vary the efficiency of the correction mechanism provided by the present invention. In this regard, it will be understood that the choice of these values is based on balance between delay and burst recovery. As higher values of p are used, the decoder will be able to recover more packets lost at once. At the same time, as higher values of k are used, the decoder will have to wait longer to recover lost packets, which, as explained above, would be undesirable for transmission of real-time media signals such as voice, video or audio.

For instance, using (n, k) values of (10, 9), an encoder would derive one redundancy block from every nine payload blocks and would include that redundancy block in one of the next nine packets. If exactly one of nine sequential packets is then lost in transmission, the lost payload can be recovered as described above. If, however, more than one of nine packets is lost in transmission, the one redundant block would not enable recovery of all of the lost packets.

Using (n, k) values of (10, 8) instead, the encoder of the preferred embodiment would create two RS-coded redundancy blocks from every eight payload blocks and would include those redundancy blocks in two of the next eight payload blocks. With this setting, it is possible according to the present invention to lose up to any two of eight sequential packets and to recover those lost packets using the two RS-coded redundant blocks.

For transmissions of coded voice signals over the Internet, an RS-coder using (n, k) values of (4, 3) is preferred. With these values, the transmission system can survive a loss of one packet in every four, which would be a 25% loss rate.

In contrast, for transmissions of coded video signals over the Internet, an RS-coder using (n, k) values of (18, 9) is preferred. These values provide nine redundancy blocks and therefore allow for recovery from a loss of nine packets out of every eighteen. These (n, k) values would work particularly well in the context of the H.263 low bit rate video coding standard currently recommended by the International Telecommunications Union, because the H.263 standard calls for dividing a single video frame into 9 pieces or packets. Therefore, each video frame could be separately corrected according to the present invention as long as the next video frame arrives completely.

While an encoder or decoder operating in accordance with the present invention may take any of a variety of forms (such as hardware, software or firmware), both the encoding and decoding functions are preferably carried out by a computer processor operating a set of machine language instructions that are stored in a memory. As an example, the microfilm appendix includes a C++ source code listing, which can be compiled by any standard C++ compiler and executed by an appropriate processor. In this listing, the modules rs.c and rs.h are taken from the public domain web site http://hideki.iis.u-tokyo.ac.ip/~robert/rs.tar.

As the foregoing illustrates, the present invention provides a computationally simple mechanism for encoding and decoding a sequence of packets in order to recover lost packets. Beneficially, the invention accomplishes this function without increasing packet rate and without substantially increasing the data rate of transmission beyond the single FEC block (and trivial amount of other overhead) added to specified packets. As the value of p is increased, the present invention conveniently enables the recovery from larger burst errors. The present invention thus provides a powerful mechanism for reducing the effect of packet loss.

A preferred embodiment of the present invention has been illustrated and described. It will be understood, however, that changes and modifications may be made to the invention without deviating from the spirit and scope of the invention, as defined by the following claims.

We claim:

1. A method of encoding a sequence of payload blocks in a telecommunications network to enable recovery of lost payload blocks, said method comprising, in combination:

deriving p redundancy blocks from each sequential group of k of said payload blocks; and combining each of said p redundancy blocks, respectively, with a payload block in a subsequent sequential group of k of said payload blocks.

2. A method as claimed in claim I, wherein deriving p redundancy blocks comprises employing a Reed-Solomon block coder.

3. A method as claimed in claim 1, wherein combining each of said p redundancy blocks with a payload block comprises combining up to one redundancy block with a given payload block.

4. A method as claimed in claim 1, wherein said payload blocks cooperatively represent a real-time media signal selected from the group consisting of audio and video.

5. A method of coded transmission of a sequence of payload blocks in a telecommunications network, said method comprising, in combination:

deriving p redundancy blocks from each sequential group of k of said payload blocks;

combining each of said p redundancy blocks, respectively, with a payload block in a subsequent sequential group of k of said payload blocks; and transmitting packets into said network, said packets corresponding in sequence to said sequence of payload blocks, and each of said packets comprising (i) one of said payload blocks and (ii) a redundancy block, if any, combined with said payload block.

6. A method as claimed in claim 5, wherein deriving p redundancy blocks comprises employing a Reed-Solomon block coder.

7. A method as claimed in claim 5, wherein combining each of said p redundancy blocks with a payload block comprises combining up to one redundancy block with a given payload block.

8. A method as claimed in claim 5, wherein said payload blocks cooperatively represent a real-time media signal selected from the group consisting of audio and video.

9. A method of encoding a sequence of packets in a transmission system to enable recovery of lost packets, each of said packets respectively including a payload block, said method comprising, in combination:

deriving a predetermined number p of redundancy blocks from each group of a predetermined number k of said packets, p being less than or equal to k; and combining each of said redundancy blocks respectively with a packet in a subsequent group of k of said packets.

10. A method as claimed in claim 9, wherein deriving said redundancy blocks comprises employing a Reed-Solomon block coder.

11. A method as claimed in claim 10, wherein said payload blocks cooperatively represent a real-time media signal selected from the group consisting of an audio signal and a video signal.

12. An apparatus for encoding a sequence of payload blocks in a telecommunications network to enable recovery of lost payload blocks, said apparatus comprising, in combination:

a computer processor;

a memory;

a first set of machine language instructions stored in said memory and executed by said processor for deriving p redundancy blocks from each sequential group of k of said payload blocks; and a second set of machine language instructions stored in said memory and executed by said processor for combining each of said p redundancy blocks, respectively, with a payload block in a subsequent sequential group of k of said payload blocks.

13. An apparatus as claimed in claim 12, wherein said first set of machine language instructions comprises a Reed-Solomon block coder.

14. A method as claimed in claim 12, wherein said second set of machine language instructions causes said processor to combine up to one redundancy block with a given payload block.

15. A method as claimed in claim 12, wherein said payload blocks cooperatively represent a real-time media signal selected from the group consisting of audio and video.

* * * * *